(12) United States Patent
Chen et al.

(10) Patent No.: US 7,682,934 B2
(45) Date of Patent: *Mar. 23, 2010

(54) WAFER PACKAGING AND SINGULATION METHOD

(75) Inventors: Chien-Hua Chen, Corvallis, OR (US); Steven R. Geissler, Albany, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 194 days.

This patent is subject to a terminal disclaimer.

(21) Appl. No.: 11/011,640

(22) Filed: Dec. 14, 2004

(65) Prior Publication Data

US 2006/0088981 A1 Apr. 27, 2006

Related U.S. Application Data

(63) Continuation-in-part of application No. 10/975,797, filed on Oct. 27, 2004.

(51) Int. Cl.
*H01L 21/46* (2006.01)
*H01L 21/30* (2006.01)

(52) U.S. Cl. ............... 438/458; 438/455; 438/456; 438/110; 438/113; 438/118

(58) Field of Classification Search .......... 438/51, 438/55, 64, 106, 107, 118, 121, 125, 455, 438/456
See application file for complete search history.

(56) References Cited

U.S. PATENT DOCUMENTS

| | | | |
|---|---|---|---|
| 5,798,557 A * | 8/1998 | Salatino et al. | 257/416 |
| 6,055,344 A | 4/2000 | Fouquet et al. | |
| 6,265,246 B1 | 7/2001 | Ruby et al. | |
| 6,297,072 B1 * | 10/2001 | Tilmans et al. | 438/106 |
| 6,429,511 B2 * | 8/2002 | Ruby et al. | 257/704 |
| 6,441,481 B1 * | 8/2002 | Karpman | 257/711 |
| 6,465,355 B1 | 10/2002 | Horsley | |
| 6,470,594 B1 * | 10/2002 | Boroson et al. | 34/335 |
| 6,503,780 B1 * | 1/2003 | Glenn et al. | 438/116 |
| 6,514,789 B2 * | 2/2003 | Denton et al. | 438/106 |
| 6,528,864 B1 | 3/2003 | Arai | |
| 6,537,846 B2 | 3/2003 | Lee et al. | |
| 6,583,524 B2 | 6/2003 | Brandt | |
| 6,590,850 B2 | 7/2003 | Eldredge et al. | |
| 6,600,201 B2 | 7/2003 | Hartwell et al. | |
| 6,630,725 B1 | 10/2003 | Kuo et al. | |
| 6,632,698 B2 | 10/2003 | Ives | |
| 6,737,292 B2 * | 5/2004 | Seo | 438/64 |
| 6,777,263 B1 * | 8/2004 | Gan et al. | 438/106 |

(Continued)

OTHER PUBLICATIONS

IMPAS Advanced Technology Workshop on Packaging MEMS and Related Micro Integrated Nano Systems Workshop Presentations, Hilton San Jose South/Scotts Valley, Scotts Valley, CA (14 pgs.).

(Continued)

*Primary Examiner*—Jack Chiang
*Assistant Examiner*—Khanh B. Duong

(57) ABSTRACT

A method includes providing a micro device wafer having micro devices supported by a wafer substrate and a multi-device lid substrate coupled to and spaced from the wafer substrate. The method further includes sawing through the multi-device lid substrate to a depth between the wafer substrate and the lid substrate.

32 Claims, 4 Drawing Sheets

U.S. PATENT DOCUMENTS

| | | | |
|---|---|---|---|
| 6,787,897 B2 * | 9/2004 | Geefay et al. | 257/704 |
| 6,838,762 B2 * | 1/2005 | Tao et al. | 257/690 |
| 6,900,509 B2 * | 5/2005 | Gallup et al. | 257/414 |
| 6,982,470 B2 * | 1/2006 | Omori | 257/434 |
| 7,026,189 B2 * | 4/2006 | Chen et al. | 438/113 |
| 7,045,868 B2 * | 5/2006 | Ding et al. | 257/414 |
| 7,115,961 B2 * | 10/2006 | Watkins et al. | 257/433 |
| 2002/0170175 A1 * | 11/2002 | Aigner et al. | 29/884 |
| 2003/0183407 A1 * | 10/2003 | Ma et al. | 174/52.4 |

OTHER PUBLICATIONS

EVG, EV620 Series, Precision Alignment Systems, from http://www.EVGroup.com (28 pgs.).

Kirt R. Williams, *Senior Member, IEEE*, Kishan Gupta, *Student Member, IEEE*, and Matthew Wasilik, *Etch Rates for Micromachining Processing —Part II*, Journal of Microelectromechanical Systems, vol. 12, No. 6, Dec. 2003 (18 pgs.).

* cited by examiner

WAFER PACKAGING AND SINGULATION METHOD

CROSS REFERENCE TO RELATED APPLICATIONS

The present continuation-in-part patent application claims priority under 35 U.S.C. § 120 from co-pending U.S. patent application Ser. No. 10/975,797 filed on Oct. 27, 2004 by Chien-Hua Chen, Zhizhang Chen and Steven R. Geissler and entitled Method of Singulating Electronic Devices, the full disclosure of which is hereby incorporated by reference.

BACKGROUND

Micro components or micro devices generally refer to either electronic components or machines with dimensions in the order of micrometers. Micro electronics generally relates to electronic circuitry or integrated circuits formed on silicon chips, such as transistors. Micro machines generally refer to micro engineered devices having moving parts. Micro machines are also commonly known as micro-electro-mechanical systems (MEMS). Micro machines are commonly used in accelerometers, pressure sensors, actuators, fluidic devices, biomechanical devices and other miniature machines. Many micro systems include both micro electronics and micro machines.

Due to their small size, micro devices are commonly packaged with a lid or protective coating. Because micro machines by nature include one or more moving parts, micro machines are especially vulnerable to damage from the environment. Many micro machines are surrounded by a hermetic seal. Communication with the sealed micro machine is typically achieved via one or more electrical contact points or contact pads projecting beyond the seal.

Due to their small size, multiple micro devices are typically formed together on a single common substrate such as a silicon wafer. Fabricating multiple micro devices on a single wafer reduces fabrication costs. However, the packaging of multiple micro devices while still part of a wafer and later singulating the wafer into a plurality of dies containing individual micro devices is typically complex, tedious and expensive. With present techniques, is extremely difficult to effectively seal each micro device yet expose contact points or pads of each device while the device is still part of a wafer.

DETAILED DESCRIPTION OF AN EXAMPLE EMBODIMENTS

Figure 1:
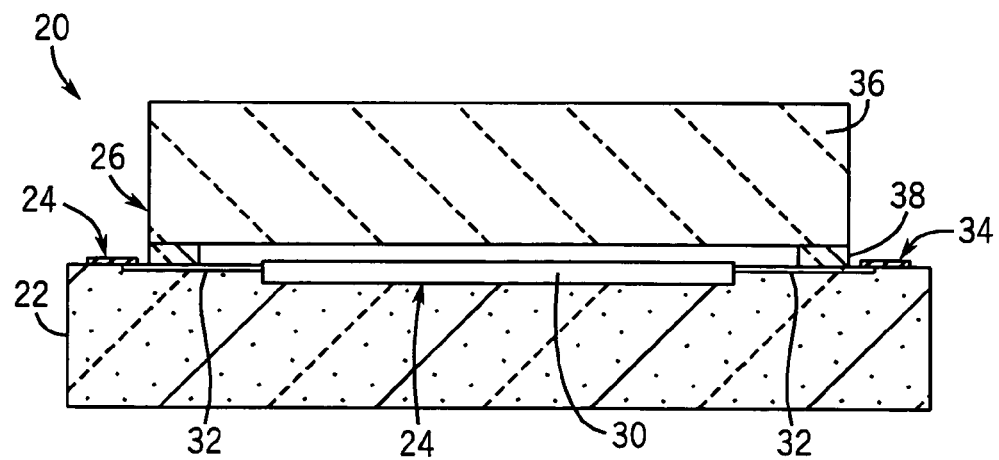
FIG. 1 is a sectional view of an example of micro device die fabricated according to one exemplary embodiment of a packaging and singulation method of the present invention.

FIG. 1 is a sectional view of a completed micro device die 20 fabricated according to one embodiment of the present invention. Micro device die 20 includes device substrate 22, micro device 24 and protective single device lid 26. Substrate 22 serves as a base or foundation for micro device 24. In the particular embodiment illustrated, substrate 22 generally comprises a layer of silicon. In alternative embodiments, substrate 22 may be provided by one or more alternative materials formed in one or more layers.

Micro device 24 is supported by substrate 22 and includes main portion 30, communication leads 32 and contact points 34. Main portion 30 generally comprises the main operating components of device 24 that are protected by protective single device lid 26. In the particular embodiments illustrated, micro device 24 comprises a micro machine. Main portion 30 includes those moving portions of the micro machine. For example, in one specific embodiment, micro device 24 comprises a defractive light device (DLD) or a digital mirror device (DMD), wherein main portion 30 includes a movable mirror. In alternative embodiments, micro device 24 may comprise other forms of micro machines or may alternatively comprise micro electronics, wherein main portion 30 has alternative configurations.

Communication leads 32 generally extend from main portion 30 between substrate 22 and protective single device lid 26. Leads 32 facilitate communication between contact points 34 and main portion 30. Contact points 34 generally comprise ports or locations connected to leads 32 and positioned on substrate 22 outwardly beyond protective single device lid 26. Points 34 facilitate communication with main portion 30 while main portion 30 is protected or sealed by single device lid 26. In the particular embodiment illustrated, points 34 comprise pads formed from electrically conductive material which are conductively connected to leads 32 which are also formed from electrically conductive material. Points 34 and leads 32 enable electrical signals or voltages to be transmitted to main portion 30 of device 24. In alternative embodiments, leads 32 and points 34 may comprise other means for communicating with main portion 30 while main portion 30 remains protected by system 26. In still other embodiments, lead 32 and contact points 34 enable main portion 30 to communicate with surrounding environment. For example, lead 32 and contact 34 may be configured to react to the environment in a predetermined fashion, enabling main portion 30 to function as a sensor or to respond to the surrounding environment. For example, in one embodiment, lead 32 and contact 34 may be thermally conductive to conduct heat from the surrounding environment to main portion 30.

Protective single device lid 26 protects main portion 30 from environmental damage. Single device lid 26 includes single lid substrate 36 and seal 38. Lid substrate 36 generally comprises an imperforate covering member coupled to device substrate 22 such that main portion 30 of micro device 24 is protected between substrate 22 and single lid substrate 36. For purposes of the disclosure, the term coupled shall mean the joining of two members directly or indirectly to one another. Such joining may be stationary in nature or movable in nature. Such joining may be achieved with the two, members or the two members and any additional intermediate members being integrally formed as a single unitary body with one another or with the two members or the two members and any additional intermediate member being attached to one another. Such joining may be permanent in nature or alternatively may be removable or releasable in nature. In the particular embodiment illustrated, single lid substrate 36 is indirectly coupled to substrate 22 by seal 38. In alternative embodiments, single lid substrate 36 may be directly coupled to substrate 22. Single lid substrate 36 is formed from silicon or non-silicon materials. In the particular embodiment illustrated in which each micro device 24 comprises a DLD, single lid substrate 36 is formed from one or more at least partially transparent materials. In one embodiment, single lid substrate 36 is formed from glass. In other embodiments, single lid substrate 36 is formed from such materials as kovar, ceramics, liquid crystal polymers and the like.

Seal 38 generally comprises a structure coupled between substrate 22 and single lid substrate 36 so as to form a seal about main portion 30. In the particular embodiment illustrated, seal 38 hermetically seals main portion 30. In one embodiment, seal 38 comprises a bond ring formed from material such as glass frit, gold tin (AuSn) or other materials extending completely about main portion 30 so as to space single lid substrate 36 from main portion 30. In one embodiment, seal 38 is first coupled to single lid substrate 36 and is then coupled to substrate 22. In another embodiment, seal 38 is first coupled to substrate 22 prior to single lid substrate 36 being coupled to substrate 22. In other embodiments, seal 38 may be integrally formed as a single unitary body with single lid substrate 36 or as part of substrate 22.

Figure 2:
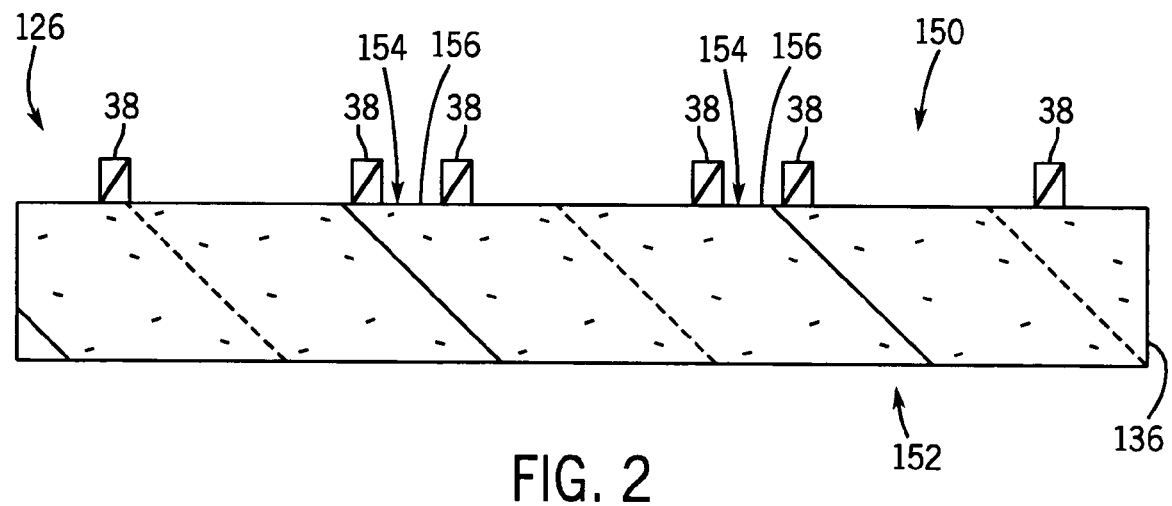
FIG. 2 is a sectional view of the formation of seals on a multi-lid substrate according to an exemplary embodiment.
Figure 3:
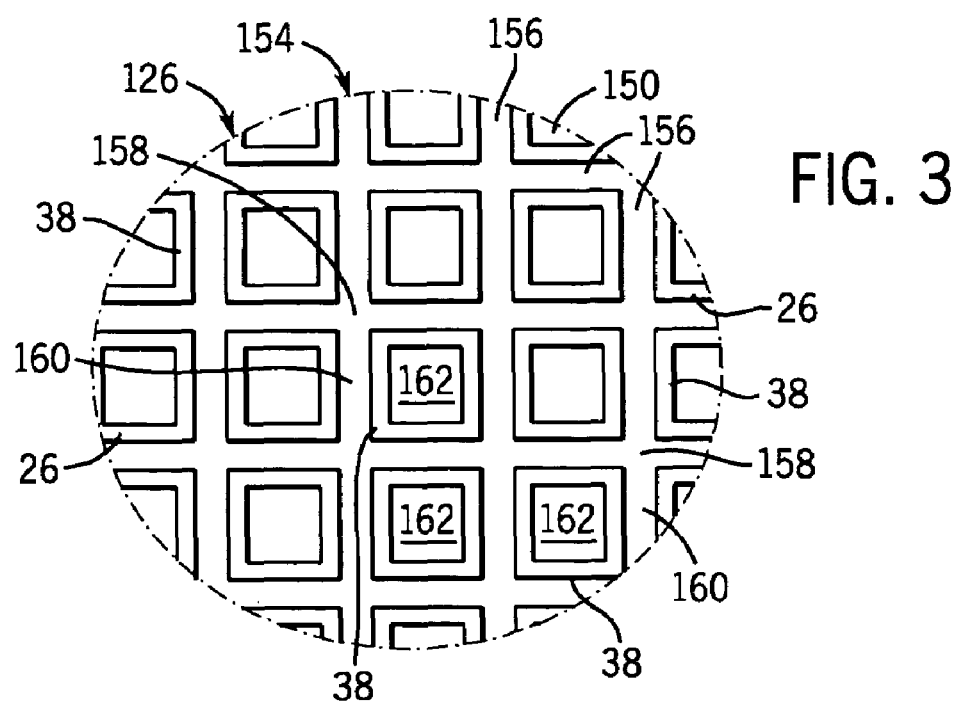
FIG. 3 is a top plan view of the protective multi-device lid of FIG. 3 according to an exemplary embodiment.
Figure 4:
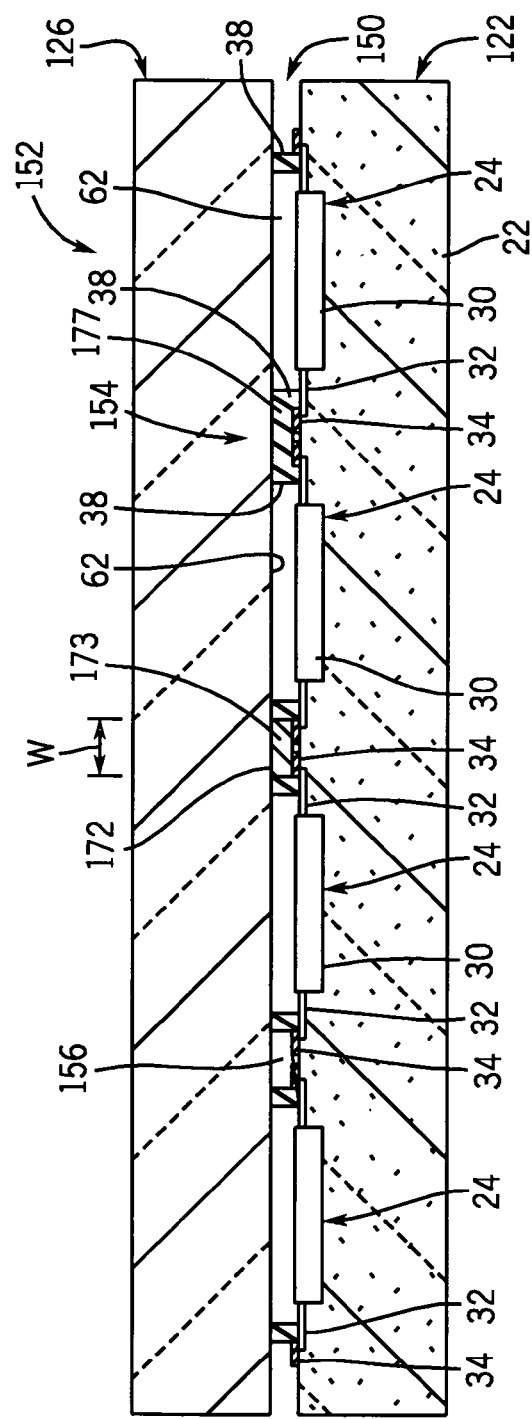
FIG. 4 is a sectional view illustrating the protective multi-device lid of FIG. 4 coupled to a micro device wafer according to an exemplary embodiment.
Figure 5:
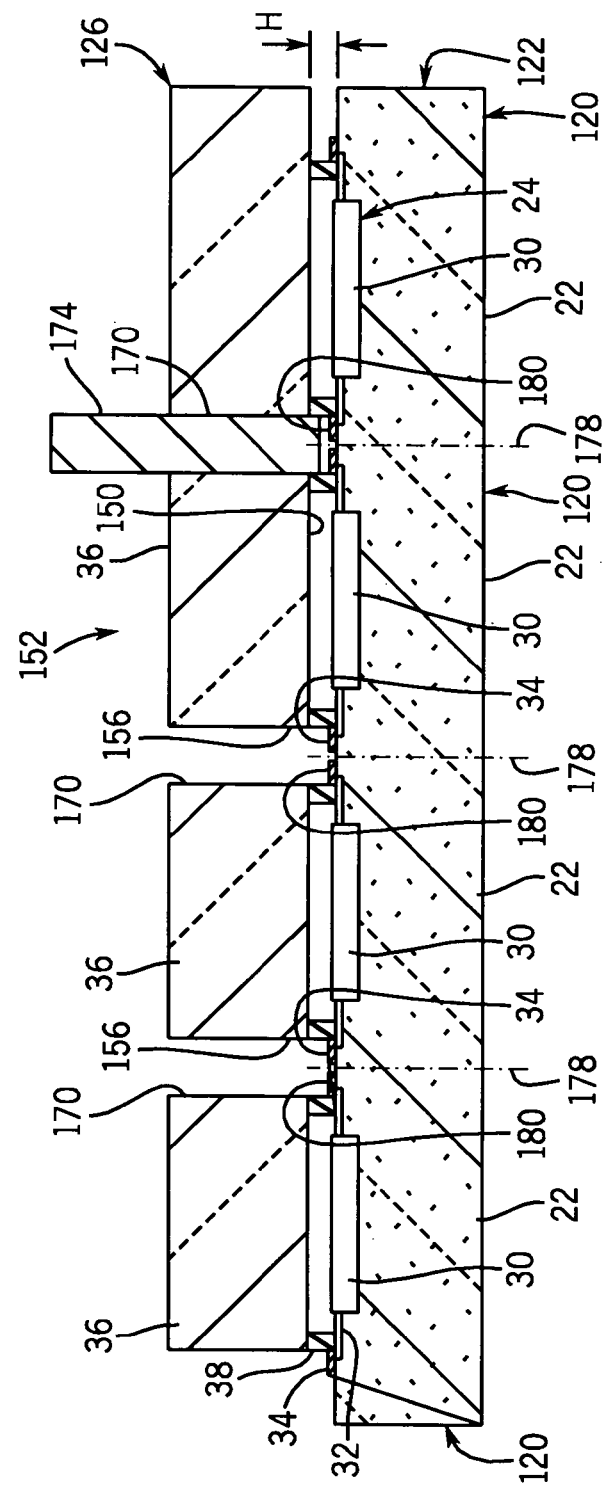
FIG. 5 is a sectional view illustrating the formation of access channels through the protective multi-device lid of FIG. 5 prior to singulation of the micro device wafer of FIG. 5 into individual dies according to an exemplary embodiment.

FIGS. 2-6 illustrate an exemplary method for fabricating a plurality of micro device dies 20 from larger wafers. FIG. 3 illustrates protective multi-device lid 126 which provides a plurality of lids 26. FIG. 5 illustrates the protective multi-device lid 126 coupled to a micro device wafer 122 which provides a plurality of interconnected substrates 22 supporting a plurality of micro devices 24. FIG. 5 further illustrates the joined micro device wafer 122 and protective multi-device lid 126 being singulated into individual micro device dies 120. FIGS. 2 and 3 illustrate the fabrication of protective multi-device lid 126. As shown by FIG. 2, multi-device lid 126 is initially formed from a multi-lid substrate 136 formed from the one or more materials from which lid substrate 36 is made. Multi-lid substrate 136 has a dimension such that multi-lid substrate 136 provides a plurality of lids 36 for protecting a plurality of micro devices of a micro device wafer 122 (shown in FIG. 4). Multi-lid substrate 136 has a first side 150 and a second opposite side 152.

As shown by FIGS. 2 and 3, protective multi-device lid 126 includes seals 38. Seals 38 are generally formed along surface 150. Seals 38 may be bonded to surface 150 or may be formed upon surface 150. Seals 38 may be formed utilizing masking and/or photolithographic techniques. In lieu of seals 38 being formed by bonding or depositing one or more materials to surface 150, seals 38 may alternatively be formed by removing material from side 150. Seals 38 provide a seal between multi-lid substrate 136 and micro device wafer 122 (shown in FIG. 5). As will be described in greater detail greater hereafter, seals 38 further space multi-device substrate 136 from micro device wafer 122 by a sufficient distance to facilitate sawing of multi-lid substrate 136 into a plurality of distinct lids 36.

In the particular embodiment illustrated, seals 38 comprise bond rings. Seals 38 are generally formed by photolithography techniques upon multi-lid substrate 136. According to one method, a layer of adhesive material, such as 500 angstroms of titanium tungsten, is deposited upon surface 150 of substrate 136. Thereafter, sealing material is deposited upon the layer of adhesive. As noted above, in one embodiment, gold tin (AuSn) or other materials may be used as a sealing material. A layer of photo resist is then patterned on the sealing material and a chemical etching process is performed to remove portions of the sealing material and the adhesive material upon surface 150 to create seals 38.

Figure 6:
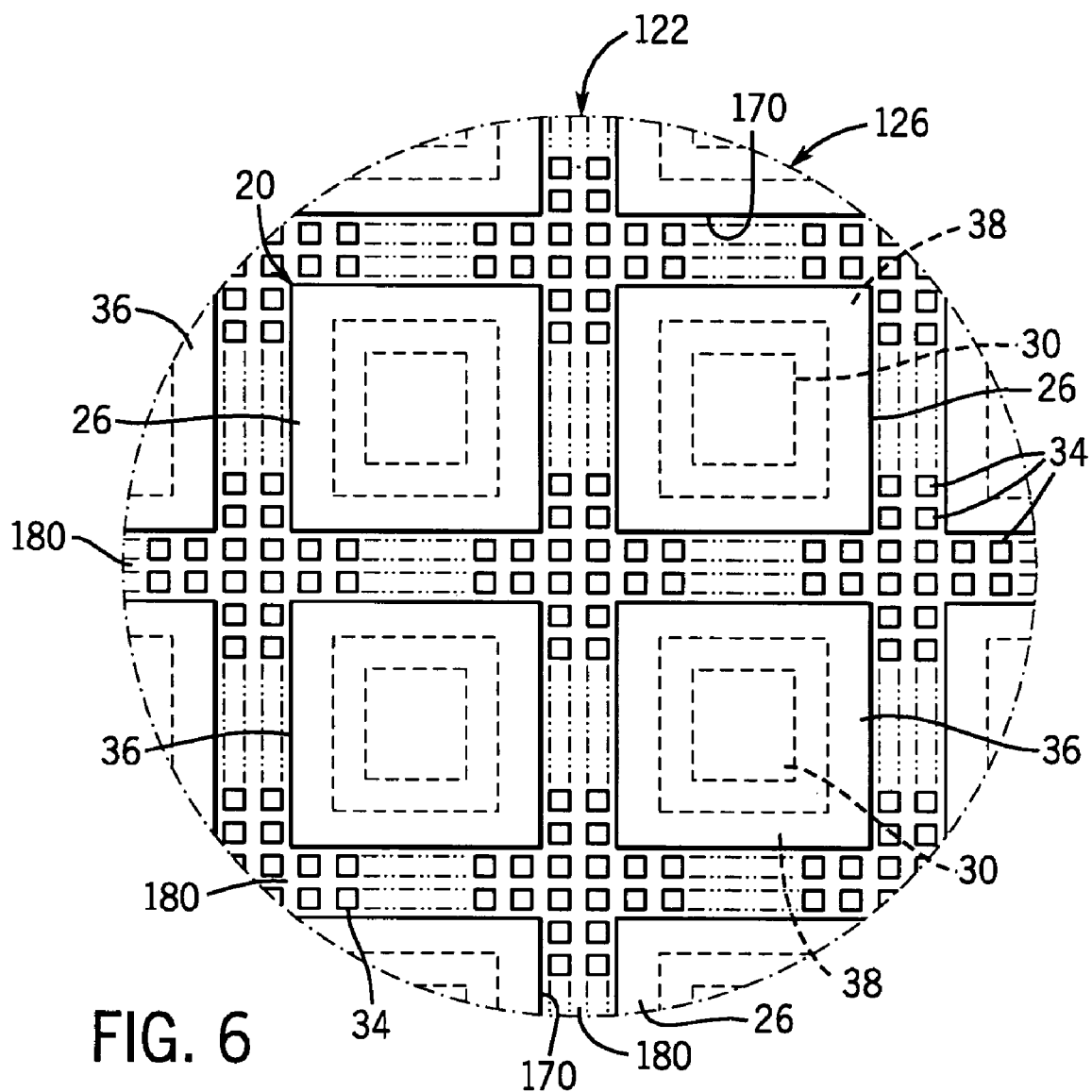
FIG. 6 is a top plan view of the joined protective multi-device lid and micro device wafer of FIG. 6 after the formation of the access channels according to an exemplary embodiment.

In other embodiments, seals 38 may be formed upon surface 150 using other techniques. In lieu of being formed on surface 150, seals 38 may be separately formed and collectively or individually mounted to surface 150. In other embodiments, seals 38 may comprise other sealing structures that may or may not join individual lids 36 to substrate 22 in addition to sealing about main portion 30 of each micro device 24 (shown in FIG. 1). Although seals 38 are illustrated as being generally rectangular or square, seal rings 38 may alternatively have other shapes depending upon the size and shape of main portion 30 of micro device 24 that must be protected. Although protective multi-device lid 126 is illustrated as having seals 38 coupled to multi-lid substrate 136, protective multi-device lid 126 may alternatively omit seals 38, wherein seals 38 are coupled to micro device wafer 122 (in locations such as shown in FIGS. 4, and 6) prior to protective multi-device lid 126 being coupled to micro device wafer 122.

As shown by FIG. 3, seals 38 form recessed pattern 154 along side 150. As shown by FIGS. 2 and 3, pattern 154 comprises a multitude of individual channels 156 which extend along side 150 between seals 38. Channels 156 are generally linear and intersect one another such that pattern 154 includes intersection portions 158 and non-intersection portions 160. Intersection portions 158 are those locations or areas along surface 150 where channels 154 intersect or overlap one another. Non-intersection portions 160 are those locations or areas along surface 150 where channels 156 do not overlap or intersect with one another.

Figure 3A:
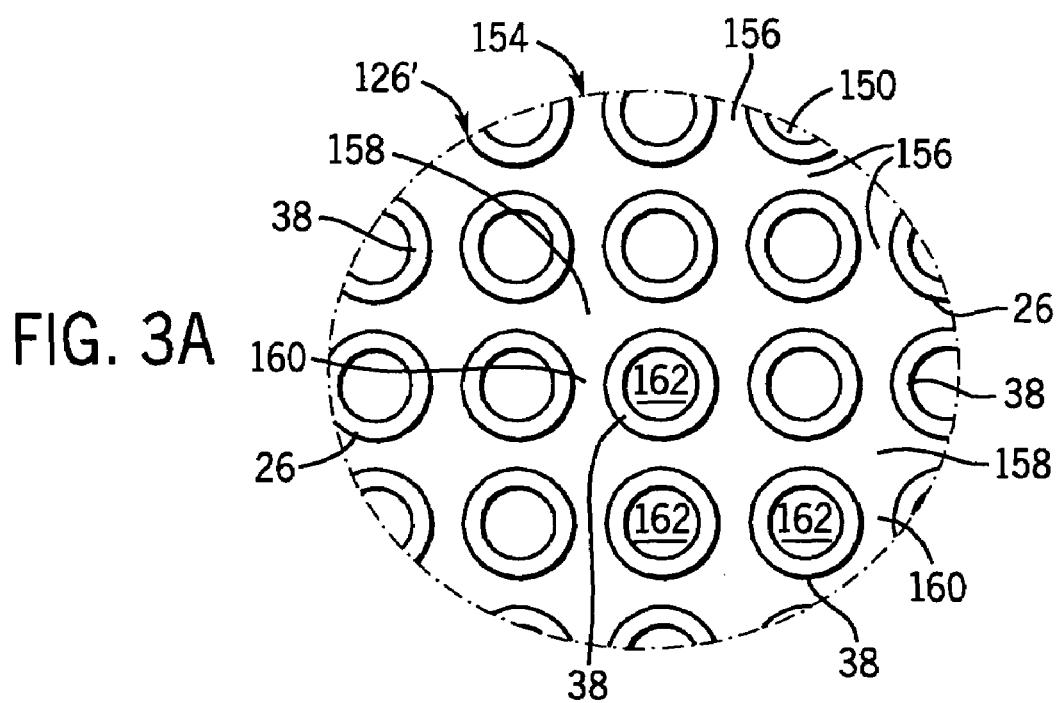
FIG. 3A is a top plan view of another exemplary embodiment of the protective multi-device lid of FIG. 4.

As further shown by FIG. 3, seals 38 surround portions 162 along surface 150. Each raised portion 162 is dimensioned so as to completely extend across an opposite main portion 30 of a micro device 24 (shown in FIG. 1) when protective multi-device lid 126 is coupled to micro device wafer 122 with side 150 facing micro device wafer 122. Intersection portions 158 of pattern 154 are located and sized such that each intersection portion 158 extends adjacent to at least two micro devices 24 of micro device wafer 122 when protection multi-device lid 126 is coupled to micro device wafer 122. In particular applications, intersection portions 158 extend adjacent to at least three and nominally four micro devices 24. At the same time, non-intersection portions 160 of pattern 154 are located and dimensioned such that only a single non-intersection portion 160 extends between consecutive micro devices 24 of micro device wafer 122 when protection multi-device lid 126 is coupled to micro device wafer 122. As will be described in greater detail hereafter, this overall configuration of pattern 154 facilitates improved packaging and easier singulation of micro device wafer 122. Although pattern 154 is illustrated as being formed from a plurality of linear channels that intersect one another such that portions 162 extend along surface 150 in a checkerboard pattern, channels 156 may alternatively consist of non-linear trenches such that pattern 154 has other overall patterns along surface 150. FIG. 3A illustrates multi-device lid 126' in which pattern 154 is nonlinear and in which seals 38 have nonlinear sides.

FIG. 4 illustrates protective multi-device lid 126 coupled to micro device wafer 122. As shown by FIG. 4, portions 62 extend opposite and beyond main portions 30 of micro devices 24. Seals 38 extend from multi-lid substrate 136 and extend across multiple communication leads 32 and generally between main portion 30 and proximate portions of pattern 154.

Channels 156 forming non-intersection portions 160 of pattern 154 generally have a width W so as to form channels 156 which are each sufficiently wide so as to extend opposite the contact points 34 of two consecutive micro devices 24. As a result, once when those portions of multi-lid substrate 136 are cut from side 152 to pattern 154, contact points 34 of consecutive micro devices 24 are simultaneously exposed. In the particular embodiment illustrated, non-intersection portions 160 have a width W of at least about 50 micrometers. In one embodiment, non-intersection portions 160 have a maximum width of about 2000 micrometers.

FIG. 6 illustrates the joined micro device wafer 122 and protective multi-device lid 126 being singulated into individual micro device dies 20. In the embodiment illustrated, the portions of multi-lid substrate 136 are removed in a manner such that the material between the resulting lids 36 does not fall onto or damage contact points 34. In one embodiment, the portions of multi-lid substrate 136 are removed by cutting into and through multi-lid substrate 136 such that the material being removed is substantially reduced in size and weight and is substantially forced away from contact point 34. In one embodiment, the portions of multi-lid substrate 136 opposite channels 156 are removed by sawing.

FIG. 5 illustrates a saw blade 174 sawing through multi-lid substrate 136 to a depth so as to connect with channels 156. Although a single saw blade 174 is illustrated, multiple side-by-side saw blades may alternatively be used to saw multi-lid substrate 136 to provide open communication with channels 156. As shown by FIG. 5, seals 38 space multi-lid substrate 136 from micro device wafer 122. In particular, seals 38 space multi-lid substrate 136 from micro device wafer 122 by a height H no less than the maximum position variability for saw blade 174. Saw blade 174 is moved or lowered so as to cut through multi-lid substrate 136 from side 152 towards wafer 122 until surface 150 of substrate 136 is broached so as to expose channels 156 between seals 38. Because seals 38 space surface 150 of substrate 136 from wafer 122 by a height H no less than the position variability of saw blade 174, seals 138 lessen the chance of accidental damage to contact points 34 during the sawing of multi-lid substrate 136. In one particular embodiment, seals 38 space multi-lid substrate 136 from micro device wafer 122 by a height H of at least 10 microns. In the particular example shown, saw blade 174 may be calibrated to within 20 micrometers while seals 38, comprising bond rings, have a height H of at least about 30 micrometers.

To further prevent possible damage to contact points 34 during the removal of the material to form the channels 170, a protective material may be provided between floors 172 of channels 156 and one or more of contact points 34. For example, in one embodiment, channels 156 may be backfilled such that floors 172 are coated with a protective material 173 (shown in FIG. 4) such as polyvinylacetate (PVA). This coating protects contact points 34 from saw chipping. Protective material 173 is removed as access channels 170 (shown in FIG. 5) are formed. Any protective material 173 remaining after formation of channels 170 may be removed using subsequent material removal techniques.

In other embodiments, protective material 173 (shown in FIG. 4) may be deposited upon contact points 34 prior to sawing to protect contact points from damage due to saw chipping. In particular applications, protective material 173 may be removed once access channels 170 (shown in FIG. 5) are formed.

In the particular embodiments, a material may be deposited upon side 150 of lid 126 or upon wafer 122 prior to joining of lid 126 and wafer 122 so as to simultaneously form seals 38 and an intermediate sacrificial portion 177 which are integral and unitary with one another. Sacrificial portion 177 extends generally over contact points 34. After substrate 126 is sawed or cut to form access openings 170, any remaining protective portion 177 may be removed from above contact points 34 while maintaining the integrity of seals 38. In other embodiments, multiple saw cuts may be employed to form a desired width or depth. In other embodiments, such protective coatings or fillings may be omitted.

FIG. 6 illustrates the joined micro device wafer 122 and protective multi-device lid 126 after portions of multi-lid substrate 136 opposite pattern 154 have been removed. As shown by FIG. 6, the formation of access channels 170 within multi-lid substrate 136 divides protective multi-device lid 126 into a plurality of distinct die packages 26 including individual lids 36 and the underlying seals 38. At the same time, multiple contact points 34 along all sides of main portions 30 of micro devices 24 and along all sides of the resulting lids 36 are simultaneously exposed. In the particular embodiment illustrated in which pattern 154 includes multiple linear channels 156 that intersect one another, each pass of one or more saw blades across side 152 of multi-lid substrate 136 exposes contact points 34 along sides of multiple micro devices 24. As a result, manufacturing costs and complexity are reduced while overall packaging yield is improved.

Once those portions of multi-lid substrate 136 opposite channels 156 are removed to form access channels 170, micro device wafer 122 is separated into distinct die substrates 22 which results in the individual micro device dies such shown in FIG. 1. As shown by FIG. 5, micro device wafer 122 is generally separated into individual dies along separation lines 178. Separation lines 178 generally extend between contact points 34 of consecutive micro devices 24. Separation lines 178 pass through that portion of passageway 180 which extended opposite 156. Because of the spacings between lids 36 provided by channels 156 and access channels 170, separation of micro device substrate 122 in individual dies along separation lines 178 is simplified and performed with greater control.

Overall, protective multi-device lid 126 and the disclosed method for packaging micro device wafer 122 achieve several advantages over conventionally known packaging methods. Because the packaging of the individual micro devices 24 is achieved while micro devices 24 are part of the micro device wafer, packaging costs are reduced. Because lids 36 and seals 38 are coupled to micro device wafer 122 as a multi-device lid, the packaging costs are even further reduced. At the same time, individual devices 24 are hermetically sealed and protected prior to multi-lid substrate 136 being separated into distinct lids 36 and prior to micro device wafer 122 being separated into distinct dies. Consequently, the overall package yield is improved.

Moreover, because channels 156 create a natural spacing buffer to protect contact points 34, sawing may be used to form access channels 170. As a result, the selection of materials for multi-lid substrate 136 is not limited due to a specific required material removal technique. This enables non-silicon materials, such as glass, kovar, ceramic, liquid crystal polymer and the like to be utilized for multi-lid substrate 136. The disclosed packaging and singulation method also allows contact points 34 to be exposed on all sides of micro device 24 without requiring complex techniques for exposing such points. In summary, the disclosed packaging and singulation method addresses the key requirements of low cost micro device packaging: (1) a wafer-level process, (2) high yield potential, (3) environmental control inside a hermetic package, (4) protection of the micro device during singulation and (5) exposed communication points around multiple sides of the die.

Although the foregoing has been described with reference to example embodiments, workers skilled in the art will recognize that changes may be made in form and detail without departing from the spirit and scope of the disclosure. For example, although different example embodiments may have been described as including one or more features providing one or more benefits, it is contemplated that the described features may be interchanged with one another or alternatively be combined with one another in the described example embodiments or in other alternative embodiments. Because the technology of the present invention is relatively complex, not all changes in the technology are foreseeable. The present invention described with reference to the example embodiments and set forth in the following claims is manifestly intended to be as broad as possible. For example, unless specifically otherwise noted, the claims reciting a single particular element also encompass a plurality of such particular elements.

What is claimed is:

1. A method comprising:
   providing a micro device wafer having micro devices supported by a wafer substrate, wherein each micro device includes a main portion and at least one contact point electrically and physically connected to and projecting from the main portion, and a multi-device lid substrate coupled to and spaced from the wafer substrate, the multi-device lid substrate having portions opposite each main portion and spaced from each opposite main portion by an empty gap;
   sawing through the multi-device lid substrate to a depth between the wafer substrate and the lid substrate, wherein the sawing forms an opening adjacent to at least one contact point of at least one device on an opposite side of the at least one contact point as the wafer substrate such that the at least one contact point is sandwiched between the wafer substrate and the opening; and
   forming a spacer between the wafer substrate and the lid substrate, wherein the formed spacer comprises a seal between the lid substrate and the wafer substrate and about each main portion between each main portion and each contact point and wherein the seal comprises a bond ring, wherein the multi-device lid substrate has a flat face opposite the wafer substrate extending across essentially an entirety of the wafer substrate, wherein the spacer includes a portion extending between the contact points and the lid substrate.

2. The method of claim 1, wherein the opening is adjacent a first contact point of a first micro device and a second contact point of a consecutive second micro device.

3. The method of claim 2, wherein each micro device has a plurality of contact points projecting from the main portion and wherein the opening is adjacent the plurality of contact points.

4. The method of claim 1, wherein each micro device has a first contact point electrically and physically connected to and on a first side of the main portion and a second contact point on a second side of the main portion and wherein the saw is configured to form openings adjacent the first contact point and the second contact point such that the first contact point and the second contact point are sandwiched between the wafer substrate and the openings.

5. The method of claim 1, wherein the sawing forms openings extending opposite a passageway portion of the micro device wafer and wherein the micro device wafer is separated into dies along separation lines within the passageway portion.

6. The method of claim 1, wherein the multi-device lid substrate includes a glass material.

7. The method of claim 1 including coupling the bond ring to the lid substrate prior to coupling the lid substrate to the wafer substrate.

8. The method of claim 1 including coupling the bond ring to the wafer substrate prior to coupling the lid substrate to the wafer substrate.

9. The method of claim 1, wherein at least one of the micro devices includes a micro-machine.

10. The method of claim 9, wherein at least one of the micro devices includes at least one display micro-machine.

11. The method of claim 1, wherein the lid substrate is at least semi-transparent.

12. The method of claim 1, wherein the lid substrate is formed from a non-silicon material.

13. The method of claim 1 including separating the micro device wafer into dies.

14. The method of claim 1 further comprising providing a protective material between the at least one of the contact point and the lid substrate such that the at least one contact point is sandwiched between the protective material and the wafer substrate and such that the protective material is out of contact with the main portions of the micro devices and completely covers the at least one contact point during the sawing, wherein the sawing through the multi-device lid substrate forms an opening through the multi-device lid substrate and adjacent to the protective material.

15. The method of claim 14 including coating the lid substrate opposite the contact points with the protective material.

16. The method of claim 14 including removing the protective material to expose the contact points.

17. The method of claim 1 including removing the portion.

18. The method of claim 1, wherein the saw used for sawing the lid substrate has a maximum position variance and wherein the lid substrate is spaced from the wafer substrate by a distance greater than the maximum position variance.

19. The method of claim 1, wherein the sawing through the multi-device lid substrate formed a channel having a floor and wherein the method further comprises singulating the wafer substrate such that portions of a floor remain after singulation.

20. The method of claim 1, wherein the bond ring is a sole spacer between the multi-device lid substrate and the wafer substrate and wherein the bond ring is formed from a group of materials consisting of gold tin and glass frit.

21. A method comprising:
   providing a micro device wafer having micro devices supported by a wafer substrate, each micro device having a main portion and a contact point electrically and physically connected to and projecting from the main portion;
   coupling a multi-lid substrate to the wafer substrate such that the lid substrate is supported and spaced above the contact point of each device; and
   sawing through the lid substrate to a depth between the wafer substrate and the lid substrate so as to expose the contact point of each micro device by forming an opening on an opposite side of the at least one contact point as the wafer substrate such that the at least one contact point is sandwiched between the wafer substrate and the opening, wherein the lid substrate is spaced from the wafer substrate by a bond ring extending above and next to the contact point and wherein the sawing through the lid substrate includes positioning a saw blade across from and opposite to the bond ring.

22. The method of claim 21, wherein the saw used for sawing the lid substrate has a maximum position variance and wherein the lid substrate is spaced from the wafer substrate by a distance greater than the maximum position variance.

23. The method of claim 21, wherein the sawing through the lid substrate exposes two contact points extending from two main portions of two micro devices with a single pass of a saw.

24. A method comprising:

providing a micro device wafer having micro devices supported by a wafer substrate, wherein each micro device includes a main portion and at least one contact point electrically and physically connected to and projecting from the main portion, and a multi-device lid substrate coupled to and spaced from the wafer substrate, the multi-device lid substrate having portions opposite each main portion and spaced from each opposite main portion by an empty gap;

sawing through the multi-device lid substrate to a depth between the wafer substrate and the lid substrate, wherein the sawing forms an opening adjacent to at least one contact point of at least one device on an opposite side of the at least one contact point as the wafer substrate such that the at least one contact point is sandwiched between the wafer substrate and the opening; and providing a protective material between the at least one of the contact points and the lid substrate such that the at least one contact point is sandwiched between the protective material and the wafer substrate and such that the protective material is out of contact with the main portions of the micro devices, wherein the sawing through the multi-device lid substrate forms an opening through the multi-device lid substrate and adjacent to the protective material.

25. A method comprising:

providing a micro device wafer having micro devices supported by a wafer substrate, wherein each micro device includes a main portion and at least one contact point electrically and physically connected to and projecting from the main portion, and a multi-device lid substrate coupled to and spaced from the wafer substrate, the multi-device lid substrate having portions opposite each main portion and spaced from each opposite main portion by an empty gap;

sawing through the multi-device lid substrate to a depth between the wafer substrate and the lid substrate, wherein the sawing forms an opening adjacent to at least one contact point of at least one device on an opposite side of the at least one contact point as the wafer substrate such that the at least one contact point is sandwiched between the wafer substrate and the opening; and forming a spacer between the wafer substrate and the lid substrate, wherein the spacer includes a portion extending between the contact points and the lid substrate.

26. A method comprising:

providing a micro device wafer having micro devices supported by a wafer substrate, wherein each micro device includes a main portion and at least one contact point electrically and physically connected to and projecting from the main portion, and a multi-device lid substrate coupled to and spaced from the wafer substrate, the multi-device lid substrate having portions opposite each main portion and spaced from each opposite main portion by an empty gap;

sawing through the multi-device lid substrate to a depth between the wafer substrate and the lid substrate, wherein the sawing forms an opening adjacent to at least one contact point of at least one device on an opposite side of the at least one contact point as the wafer substrate such that the at least one contact point is sandwiched between the wafer substrate and the opening; and forming a spacer between the wafer substrate and the lid substrate, wherein the formed spacer comprises a seal between the lid substrate and the wafer substrate and about each main portion between each main portion and each contact point and wherein the seal comprises a bond ring, wherein the multi-device lid substrate has a flat face opposite the wafer substrate extending across essentially an entirety of the wafer substrate, wherein the opening is adjacent a first contact point of a first micro device and a second contact point of a consecutive second micro device.

27. The method of claim 26, wherein the first contact point and the second contact point are each exposed after the sawing to provide a contact surface for electrical connection to external devices.

28. A method comprising:

providing a micro device wafer having micro devices supported by a wafer substrate, wherein each micro device includes a main portion and at least one contact point electrically and physically connected to and projecting from the main portion, and a multi-device lid substrate coupled to and spaced from the wafer substrate, the multi-device lid substrate having portions opposite each main portion and spaced from each opposite main portion by an empty gap;

sawing through the multi-device lid substrate to a depth between the wafer substrate and the lid substrate, wherein the sawing forms an opening adjacent to at least one contact point of at least one device on an opposite side of the at least one contact point as the wafer substrate such that the at least one contact point is sandwiched between the wafer substrate and the opening; and forming a spacer between the wafer substrate and the lid substrate, wherein the formed spacer comprises a seal between the lid substrate and the wafer substrate and about each main portion between each main portion and each contact point and wherein the seal comprises a bond ring, wherein the multi-device lid substrate has a flat face opposite the wafer substrate extending across essentially an entirety of the wafer substrate, wherein each micro device has a first contact point electrically and physically connected to and on a first side of the main portion and a second contact point on a second side of the main portion and wherein the saw is configured to form openings adjacent the first contact point and the second contact point such that the first contact point and the second contact point are sandwiched between the wafer substrate and the openings.

29. The method of claim 28, wherein the first contact point and the second contact point are each exposed after the sawing to provide a contact surface for electrical connection to external devices.

30. A method comprising:

providing a micro device wafer having micro devices supported by a wafer substrate, wherein each micro device includes a main portion and at least one contact point electrically and physically connected to and projecting from the main portion, and a multi-device lid substrate coupled to and spaced from the wafer substrate, the multi-device lid substrate having portions opposite each main portion and spaced from each opposite main portion by an empty gap;

sawing through the multi-device lid substrate to a depth between the wafer substrate and the lid substrate, wherein the sawing forms an opening adjacent to at least one contact point of at least one device on an opposite side of the at least one contact point as the wafer substrate such that the at least one contact point is sandwiched between the wafer substrate and the opening;

forming a spacer between the wafer substrate and the lid substrate, wherein the formed spacer comprises a seal between the lid substrate and the wafer substrate and about each main portion between each main portion and each contact point and wherein the seal comprises a bond ring, wherein the multi-device lid substrate has a flat face opposite the wafer substrate extending across essentially an entirety of the wafer substrate;

providing a protective material between the at least one of the contact point and the lid substrate such that the at least one contact point is sandwiched between the protective material and the wafer substrate and such that the protective material is out of contact with the main portions of the micro devices, wherein the sawing through the multi-device lid substrate forms an opening through the multi-device lid substrate and adjacent to the protective material; and removing the protective material to expose the contact points.

31. The method of claim 30, wherein the protective material completely covers the at least one contact point during the sawing.

32. The method of claim 30, wherein the removing of the protective material to expose the contact points is performed after completion of the sawing.

* * * * *